United States Patent [19]

Koike et al.

[11] 4,209,806
[45] Jun. 24, 1980

[54] SOLID-STATE IMAGING DEVICE

[75] Inventors: Norio Koike, Tokyo; Iwao Takemoto, Kodaira; Toshiyuki Akiyama, Kokubunji; Haruhisa Ando, Kokubunji; Shinya Ohba, Kokubunji; Masatada Horiuchi, Koganei; Masaharu Kubo, Hachioji, all of Japan

[73] Assignee: Hitachi, Ltd., Japan

[21] Appl. No.: 928,734

[22] Filed: Jul. 27, 1978

[30] Foreign Application Priority Data

Aug. 1, 1977 [JP] Japan .................................. 52/91362

[51] Int. Cl.² .................. H04N 3/14; H01L 29/78; H01L 27/14
[52] U.S. Cl. .................................... 358/213; 357/24; 357/30
[58] Field of Search ................ 358/43, 50, 59, 213, 358/241, 167, 36; 340/173 LS

[56] References Cited

U.S. PATENT DOCUMENTS

| 3,621,283 | 11/1971 | Teer et al. | 358/213 X |
| 3,946,151 | 3/1976 | Kamiyama et al. | 358/213 |
| 4,009,333 | 2/1977 | Berger et al. | 358/213 |
| 4,052,229 | 10/1977 | Palshley | 357/91 X |
| 4,055,836 | 10/1977 | Weimer | 358/213 X |

Primary Examiner—Robert L. Griffin
Assistant Examiner—Aristotelis M. Psitos
Attorney, Agent, or Firm—Craig and Antonelli

[57] ABSTRACT

In a solid-state imaging device wherein a plurality of photoelectric conversion elements, horizontal and vertical scanning circuits for addressing the photoelectric conversion elements, and horizontal and vertical switching transistors are comprised in a major surface region of an N (or P)-type semiconductor body, a solid-state imaging device characterized in that a plurality of P (or N)-type impurity layers isolated from one another are disposed in the major surface region of the semiconductor body, that the switching transistors and the photoelectric conversion elements are integrated in one of the impurity layers, the horizontal scanning circuit being integrated in another impurity layer, the vertical scanning circuit being integrated in still another impurity layer, and that predetermined voltages are applied to electrodes disposed on the respective impurity layers.

20 Claims, 12 Drawing Figures

SOLID-STATE IMAGING DEVICE

BACKGROUND OF THE INVENTION (1) Field of the Invention

This invention relates to a solid-state image pickup device for use in a television camera etc. Particularly it relates to a solid-state imaging device which has a plurality of picture elements and horizontal and vertical scanning circuits, both of which are disposed in surface regions of a semiconductor body. More specifically, it relates to a solid-state device which has picture elements for reading out from photodiodes optical information stored therein.

(2) Description of the Prior Art

A solid-state imaging device functions to convert optical information into time-sequential electric signals. In order to achieve a high resolution, it comprises approximately 500×500 photoelectric conversion elements, switching transistors for X-Y addressing corresponding to the elements, and an X-scanner (horizontal scanning circuit) and a Y-scanner (vertical scanning circuit) which deliver scan pulses for turning the switching transistors "on" and "off." A principle construction becomes as shown in FIG. 1. Hereunder the prior art will be described with reference to the drawings, in which the same symbols designate the same or equivalent parts. In FIG. 1, numeral 1 designates a horizontal scanner, which consists of unit circuits in the number of stages corresponding to the number of photoelectric conversion elements arrayed in the horizontal direction (for example, 500). On the basis of clock pulses for driving the scanner 1, scan pulses which shift every predetermined timing interval are sequentially provided from the respective unit circuits in a horizontal scan period. Numeral 101 indicates a horizontal scan line which transmits the horizontal scan pulse. Numeral 2 designates a vertical scanner, which consists of unit circuits in the number of stages corresponding to the number of rows of the photoelectric conversion elements (for example, 500). On the basis of clock pulses for driving the scanner 2, scan pulses which shift every fixed timing interval are sequentially provided from the respective unit circuits in correspondence with the horizontal scan period during one field. Numeral 102 indicates a vertical scan line which transmits the vertical scan pulse. With the two trains of scan pulses, vertical switching transistors 3 and horizontal switching transistors 6 are sequentially turned "on" and "off" so that signals from the individual photoelectric conversion elements 4 arrayed in two dimensions may be taken out onto vertical output lines 5 and a horizontal output line 7. Since the signal from each photoelectric conversion element 4 corresponds to the optical image of an object projected thereon, a video signal can be derived by the above operation.

The solid-state imaging device is ordinarily fabricated by the use of the MOS-LSI technology which can realize a high packed integration comparatively easily and according to which the photoelectric conversion element and the switching transistor can be produced by an integral structure as has a structural section shown in FIG. 2. As seen from the figure, the vertical switching transistor is made up of a MOS (metal-oxide-semiconductor) field effect transistor (hereinbelow, abbreviated to "MOST") 3 which is provided with a gate 8 on which the vertical scan pulse is impressed. The photoelectric conversion element 4 is formed of a pn (or np-) junction photodiode which exploits the source junction of the MOST 3. The vertical output line 5 is formed of an interconnection (usually, made of Al) which is spliced with the drain of the MOST 3. The horizontal switching transistor is made up of a MOST 6 which is provided with a gate 9 on which the horizontal scan pulse is impressed. The horizontal output line 7 is formed of an interconnection (usually, made of Al) which is spliced with the drain of the MOST 6. Numeral 10 represents a semiconductor (e.g., silicon) body in which these elements are integrated. The semiconductor body 10 has the n-type conductivity (or p-type conductivity) when the sources and drains are impurity layers of the p-type conductivity (or the n-type conductivity). Numeral 11 indicates an insulating film (in general, silicon dioxide ($SiO_2$) film). The solid-state imaging device thus constructed has such excellent merits that the source junction of the MOST can be exploited as the photoelectric conversion element, and that a MOS shift register can be utilized for the scanning circuit and be integrally formed on the semiconductor body.

The solid-state imaging device of this type, however, involves problems to be stated below in relation to the construction thereof.

1. Scanning circuitry

In case of an areal solid-state imaging device, the scanning circuitry consists of the horizontal scanner for performing the scanning in the X direction and the vertical scanner for performing the scanning in the Y direction. The horizontal scanner needs to scan all the photoelectric conversion elements arranged in the X direction in the scan pulse output period of the vertical scanner (64 μs in the standard television format, 15.73 kHz in terms of the frequency). Accordingly, the scanning rate required for the horizontal scanner becomes the number of picture elements in the X direction-times (by way of example, 500 times in a device including 500 (X direction) ×500 (Y direction) picture elements) as high as the scanning rate of the vertical scanner. In many cases, however, the horizontal and vertical scanners are circuits of the same arrangement and are made by an identical process of fabrication.

The unit circuit of each stage of a typical scanner having heretofore been employed (refer to Material SSD72-36 of the Society for the Research of Semiconductors and Transistors, Denshi Tsūshin Gakkai—the Institute of Electronics and Communication) is a shift register type circuit which is constructed of one set of inverter circuits and one set of transfer gates as shown in FIG. 3A. The figure illustrates the first stage being a constituent unit of the shift register type scanner, and also a driver circuit portion therefor. Numerals 12 and 13 designate generators which generate clock pulses with their phases shifting by 180°. Numeral 14 indicates an input pulse generator which generates an input pulse $V_{IN}$ for obtaining a shift pulse at an output terminal 16 of a unit circuit 15. Shown at 17 is a driving power supply. Numeral 18 represents a transfer MOST which is turned "on" and "off" by the clock pulse $\phi_1$, while numeral 19 denotes a transfer MOST which is turned "on" and "off" by the clock pulse $\phi_2$. Shown at 20 is an inverter circuit, which is made up of a series connection consisting of a saturation type load MOST 21 with its gate and drain being spliced to the identical power supply 17 and a driver MOST 22.

FIG. 3B is a timing chart of the input and output pulses obtained with the present circuit. Upon impression of the input pulse $V_{IN}$ synchronous with the clock pulse $\phi_2$, the output pulse $V_{01}$ which has the same polarity as that of the input pulse $V_{IN}$ and which is delayed by the period $T_\phi$ of the clock pulses is provided from the output terminal 16. The output pulse $V_{01}$ also becomes an input to the next stage (not shown), and an output pulse $V_{02}$ which is similarly delayed by the period $T_\phi$ is provided from an output terminal of the next stage. Subsequently, a train of output pulses $V_{03}$ . . . which are delayed every $T_\phi$ in the same manner can be provided. Regarding the output pulses, the rising time $t_r$ ("0"→"1") is a period of time in which a capacitance $C_s$ parasitic to the output terminal 16 is charged by the load MOST. On the other hand, the falling time $t_f$ ("1"→"0") is a period of time which is required in order that the "1" voltage stored in the stray capacity $C_s$ may be discharged through the driver MOST 22. In order to effect the inverting operation, the conductance of the load MOST 21 is ordinarily selected at about 1/10 of the conductance of the drive MOST 22. For this reason, the rising time is one order greater than the falling time, and it is the rising time or the conductance of the load MOST 21 which determines the upper limit of the operating speed to be attained by the present scanner. It is accordingly necessary that the conductance $g_{ml}^H$ of the load MOST which constitutes the horizontal scanner operating at a high speed is selected to be greater than the conductance $g_{ml}^V$ of the load MOST which constitutes the vertical scanner operating at a low speed.

In this respect, however, it is desirable to manufacture both the scanners by the identical process of fabrication. Without any contrivance, the conductances of the MOST's constituting both the scanners will naturally become equal. Accordingly, the design value (e.g., the channel width or the channel length) of the MOST constituting the horizontal scanner needs to be made different so as to enhance the conductance. However, to bestow a difference of two or more orders merely by changing the design value is unfavorable in incurring such a drawback that the layout area occupied by the horizontal scanner becomes extremely large.

2. Switches

The horizontal switching transistor 6 is addressed every 64 μs in the standard television format by the high-speed horizontal scanner 1, and the vertical output line is charged up to a video voltage every 64 μs, whereas the vertical switching transistor 3 is addressed every approximately 17 ms (the field frequency is 60 Hz). Thus, the photodiode 4 operates in the so-called storage mode in which the diode is irradiated by light for 17 ms and stores therein optical signal charges generated during the time, so that the photosensitivity becomes high. The turn-off resistance of the MOST is high as compared with those of other elements such as bipolar transistor. However, even when a voltage applied to the gate is below the threshold voltage of the MOST, the transistor is not perfectly cut off but a minute current (usually called the "tailing current") flows therethrough, so that the photodiode 4 is charged through the vertical switching MOST 3. It is therefore impossible to read out a signal which reflects the optical information accurately.

3. Noise

Inductive noise which are attributed to the rise and fall of the clock pulse for driving the horizontal scanner 1 or the scan pulse delivered from each stage of the scanner leak to the horizontal signal output line 7 through stray capacitances inside or outside the semiconductor body. (Noise which are generated by the clock pulse for driving the vertical scanner or the scan pulse from the scanner pose no problem because the noise can be, in effect, eliminated from the video signal in such a way that the clock pulses are covered within a horizontal blanking period provided every horizontal scan period.) In particular, noise which arrive through the interior of the semiconductor body mix via complicated paths under the action of the resistance of the semiconductor body besides the stray capacitances. It is therefore very difficult to remove the noise by a noise processing circuit (for which a low-pass filter is generally used). For this reason, as compared with a pickup tube, the solid-state imaging device has a low signal-to-noise ratio and exhibits a poor picture quality, so that the device has the fields of application limited or its practical use hindered.

SUMMARY OF THE INVENTION

This invention improves on the prior-art solid-state imaging device described above.

A first object of this invention is to provide a solid-state imaging device which has a horizontal scanning circuit capable of operating at high speed.

A second object of this invention is to reduce the leakage current of a vertical switching transistor in a solid-state imaging device.

A third object of this invention is to reduce inductive noise and to make the signal-to-noise ratio of a solid-state imaging device high.

In brief, this invention intends to realize a solid-state imaging device which attains a high picture quality and which is practical.

As means for solving the problems of the prior-art device, it is considered regarding the scanning circuitry to make the conductance of the MOST of the horizontal scanner greater. The tailing current of the switching MOST becomes smaller as the threshold voltage is higher, and hence, as a measure for obtaining a correct optical information it is considered to make the threshold voltage of the vertical switching MOST higher. Further, regarding the arriving noise, it is considered to integrate the scanners and the switching MOST's (including the horizontal signal output line) in different regions of the semiconductor body.

Under these considerations, according to this invention, the MOST's constituting the horizontal scanner, the MOST's constituting the vertical scanner, the horizontal switching MOST's and the vertical switching MOST's can have different threshold voltages. Concretely, a plurality of regions are formed in the major surface of a semiconductor body to form the solid-state imaging device, the regions having a conductivity type opposite to that of the semiconductor body or having the same conductivity type but an impurity concentration different from that of the semiconductor body, and the elements (MOST's) having the respectively different functions are separately integrated in the plurality of regions.

BRIEF DESCRIPTON OF THE DRAWINGS

DESCRIPTION OF THE PREFERRED EMBODIMENTS

EMBODIMENT 1

Figure 4:
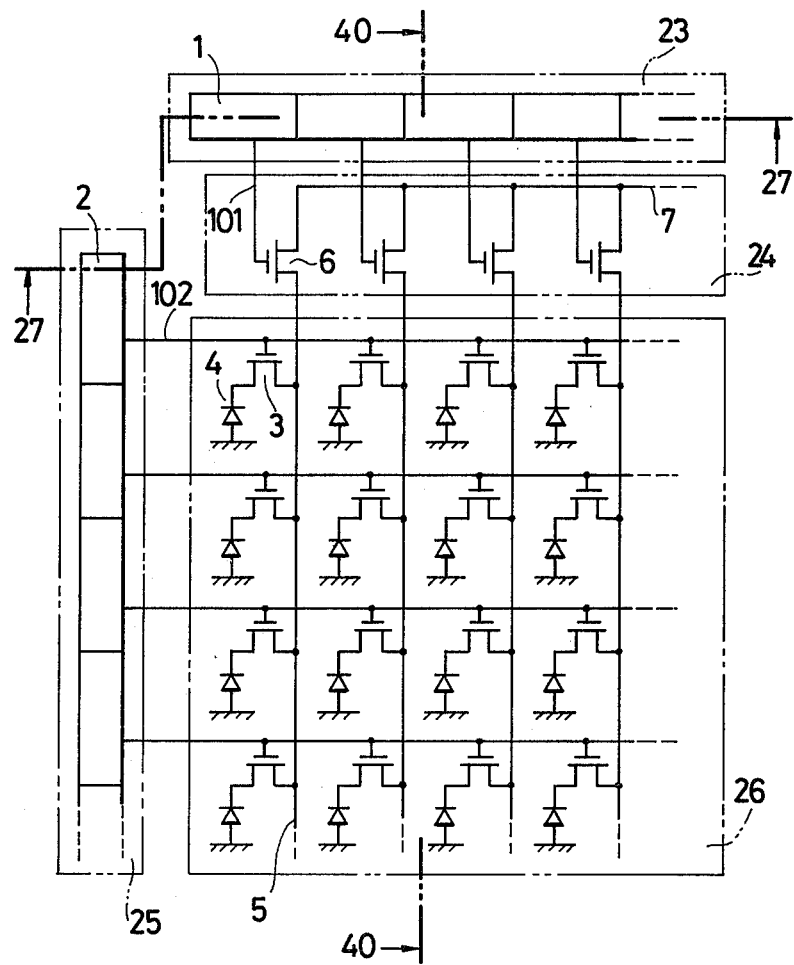
FIG. 4 is a schematic circuit diagram showing a first embodiment of the solid-state imaging device of this invention.

FIG. 4 is a conceptual diagram which shows a first embodiment of the solid-state imaging device according to this invention. Numeral 23 designates a region which includes a horizontal scanner 1, numeral 24 a region which includes horizontal switching MOST's 6, numeral 25 a region which includes a vertical scanner 2, and numeral 26 a region which includes a photoelectric conversion portion wherein picture elements each consisting of a vertical switching MOST 3 and a photodiode 4 are arrayed in two dimensions.

First of all, the scanners will be described.

Figure 1:
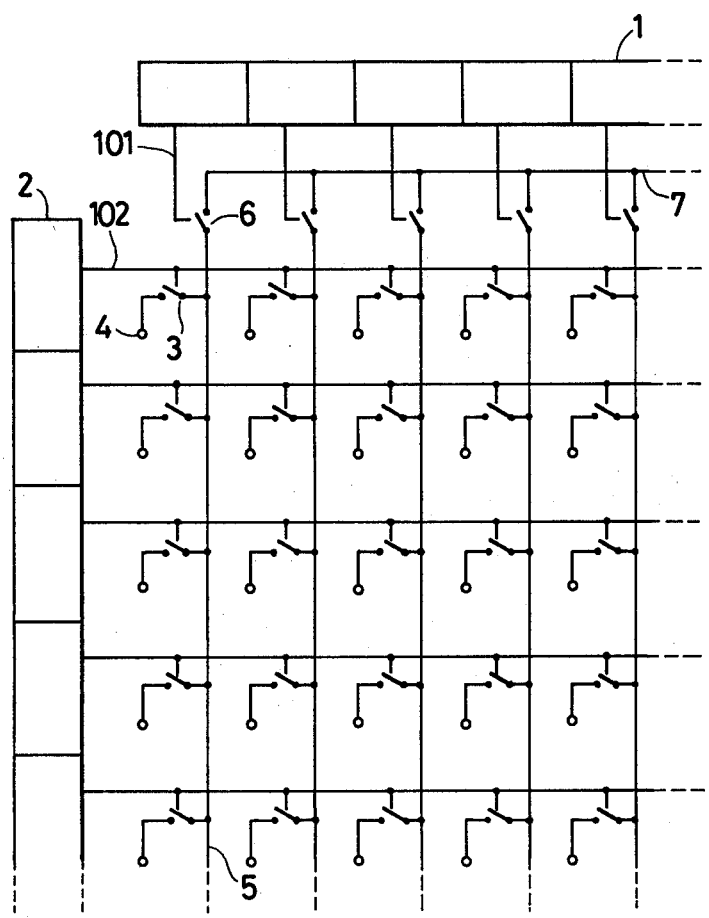
FIG. 1 is a conceptual diagram for explaining a conventional solid-state imaging device.
Figure 2:
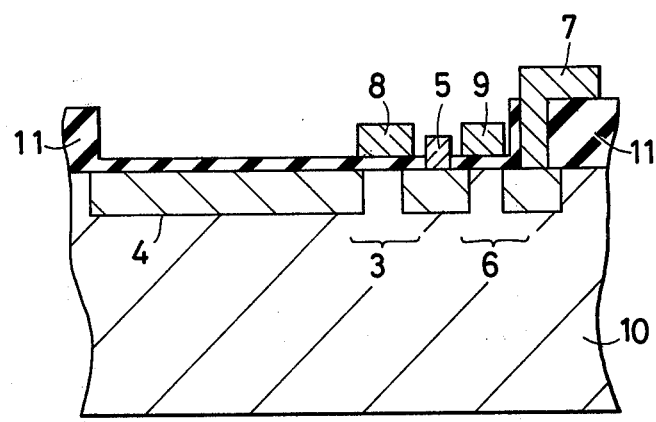
FIG. 2 is a model structural section in the case where a photodiode and switching MOST's of the conventional solid-state imaging device are put into a MOS IC.
Figure 3A:
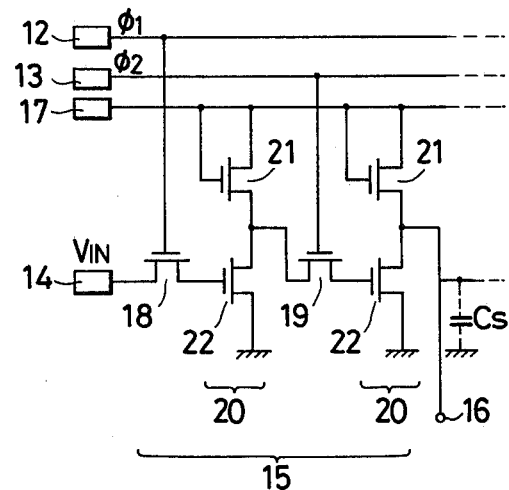
FIG. 3A is a partial circuit diagram showing an example of a prior-art scanner.
Figure 3B:
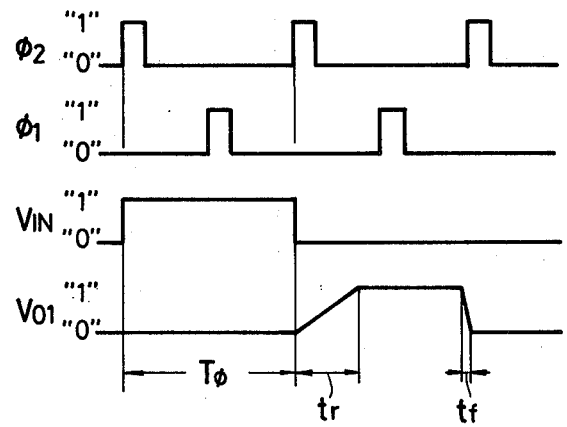
FIG. 3B is a waveform diagram of input and output pulses of the scanner shown in FIG. 3A.
Figure 3C:
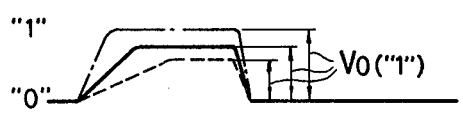
FIG. 3C is a diagram showing the variations of the rise and fall of an output pulse at the time when the threshold voltage of a load MOST of a scanner is varied.

The conductance $g_{ml}$ of the load MOST of the scanner and the "1" level voltage $V_{O("1")}$ as illustrated in FIG. 3A etc. are given by the following equations when the voltage of the power supply 17 is let to be $V_{dd}$ and the threshold voltage is let to be $V_T$:

$$g_{ml} = \beta(|V_{dd}| - |V_T|) \tag{1}$$

$$|V_{O("1")}| = |V_{dd}| - |V_T| \tag{2}$$

where $\beta$ denotes the channel conductance which is determined by the device constant of the MOST. As understood from the equations, when the threshold voltage is made small, the conductance becomes great and also the "1" level voltage becomes high. That is, as seen from FIG. 3C, the "1" level voltage $V_{O("1")}$ rises with the lowering of the threshold voltage $V_T$, and the rise time $t_r$ shortens, so that the speed of the scanner rises. On the basis of this fact, the threshold voltage $V_T^H{}_{(SC)}$ of the MOST which constitutes the horizontal scanner operating at high speed needs to be selected lower than the threshold voltage $V_T^V{}_{(SC)}$ of the MOST which constitutes the vertical scanner operating at low speed.

$$|V_T^V{}_{(SC)}| > |V_T^H{}_{(SC)}| \tag{3}$$

In the solid-state imaging device of this invention shown in FIG. 4, therefore, the threshold voltage $V_T^H{}_{(SC)}$ of the MOST of the horizontal scanner 1 included in the region 23 is set to be lower than the threshold voltage $V_T^V{}_{(SC)}$ of the MOST of the vertical scanner 2 included in the region 25 so that the relation of Eq. (3) may be fulfilled.

Now, the threshold voltages of the switching MOST's will be described. As previously stated, the horizontal switching MOST 6 turns "on" every 64 μs, whereas the vertical switching MOST 3 turns "on" at the long period of 17 ms. More in detail, the information storage time of the vertical signal output line 5 connected to the horizontal switching transistor is 64 μs, whereas that of the photodiode 4 connected to the vertical switching transistor is 500 times longer. In order to suppress the information leak of the photodiode, accordingly, it is desirable that the cut-off resistance at the turn-off of the vertical switching MOST 3 is made as great as possible. According to the inventors' measurement, the tailing current at the turn-off decreases to 1/10 by raising the threshold voltage by 0.1 V. In order to make the leak of the optical information of the vertical switching MOST 3 equal to the leak of the optical information of the horizontal switching MOST 6, the threshold voltage $V_T^V{}_{(SW)}$ of the vertical switching MOST needs to be made 0.25 V higher than the threshold voltage $V_T^H{}_{(SW)}$ of the horizontal switching MOST. It is ordinarily desirable that the threshold voltage of the MOST included in the region 26 is made higher than the threshold voltage of the MOST included in the region 24.

$$|V_T^V{}_{(SW)}| > |V_T^H{}_{(SW)}| \tag{4}$$

Since the threshold voltages of the MOST's constituting the scanners and those of the MOST's constituting the switches vary depending on required characteristics, the relationship among their magnitudes cannot be uniquely determined.

As described above, in this invention, the threshold voltages of the MOST's constituting the imaging device are set at values differing in dependence on positions. Hereunder, description will be made of a concrete structure which can control the threshold voltages in dependence on positions.

Figure 5A:
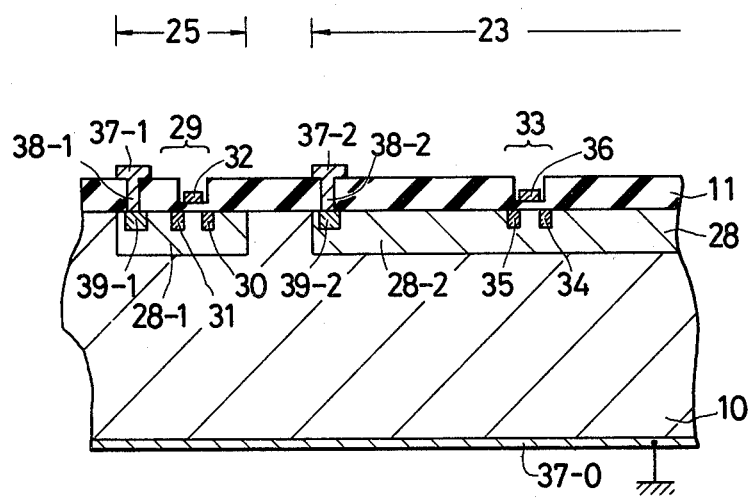
FIG. 5A shows a schematic sectional view of a horizontal scanner portion and a vertical scanner portion in the solid-state imaging device of FIG. 4.

FIG. 5A shows a sectional structure of the imaging device of this invention. It is a sectional structural view in the case where the cut planes of the vertical scanner region 25 and the horizontal scanner region 23 of the imaging device of this invention shown in FIG. 4 are seen in the direction of arrows 27 indicated in FIG. 4. Numeral 10 designates a silicon body of a first conductivity type (e.g., N-type) in which MOST's are integrated. Numeral 28 (28-1, 28-2) indicates an impurity layer, normally called "well impurity layer," of a second conductivity type (e.g., P-type). The impurity layer 28 can be simply fabricated by the conventional diffusion process. Numeral 25 denotes a region in which a vertical scanner is integrated, while numeral 23 a region in which a horizontal scanner is integrated. The vertical scanner is formed in the impurity layer 28-1, and numeral 29 designates one of the MOST's constituting the vertical scanner. Numerals 30 and 31 indicate the drain (or source) and source (or drain) of the MOST 29 respectively, both of which are formed of impurity layers having the same conductivity type as that of the body 10. Shown at 32 is the gate electrode of the MOST 29. Numeral 11 represents an insulating oxide film (for which a silicon dioxide (SiO₂) film is used). The horizontal scanner is formed in the impurity layer 28-2, and numeral 33 designates one of the MOST's constituting the horizontal scanner. Numerals 34 and 35 indicate the drain (or source) and source (or drain) of the MOST 33 respectively, both of which are made of impurity layers having the same conductivity type as that of the body 10. Shown at 36 is the gate electrode of the MOST 33. Numeral 37-0 designates a electrode of the body 10 which is connected to a ground reference terminal. Symbols 37-1 and 37-2 denote electrodes to which voltages for determining the potentials of the impurity layers 28-1 and 28-2 are applied, respectively. The electrodes 37-1 and 37-2 are respectively connected to the impurity layers 28-1 and 28-2 through contact holes 38-1 and 38-2 provided at parts of the insulating oxide film 11 and further impurity layers 39 (39-1, 39-2) of the second conductivity type (e.g., P-type). Although the impurity layers 39-1 and 39-2 have the same conductivity type as that of the impurity layers 28-1 and 28-2, they have an impurity concentration higher than that of the impurity layers 28-1 and 28-2 in order to effect the ohmic contact with the respective electrodes 37-1 and 37-2.

Figure 5B:
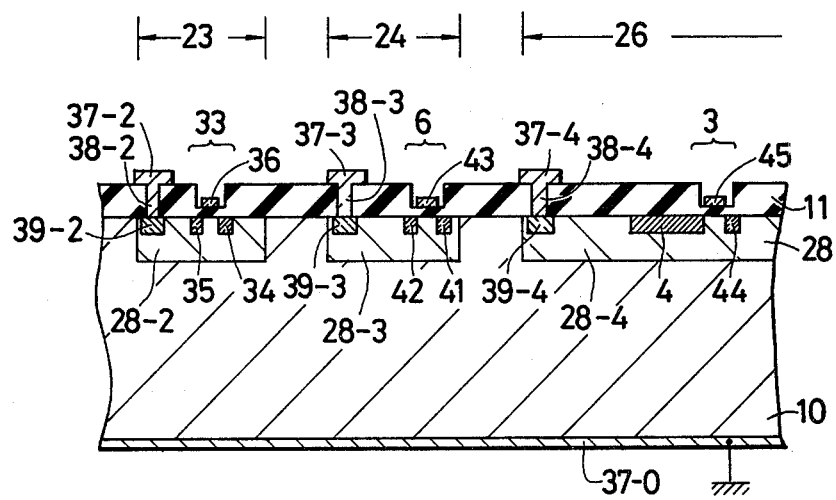
FIG. 5B shows a schematic section view of the horizontal scanner portion, a horizontal switching MOST, a vertical switching MOST and a photodiode in the solid-state imaging device of FIG. 4.

FIG. 5B is a sectional structural view in the case where the horizontal scanner region 23, the horizontal switch region 24 and the photoelectric conversion element region 26 of the imaging device of this invention shown in FIG. 4 are cut in the longitudinal direction and seen in the direction of arrows 40. Numeral 28 (28-2, 28-3, 28-4) designates a well impurity layer which is formed in the second conductivity type (e.g., P-type). The horizontal switching MOST 6 is fabricated in the impurity layer 28-3. The MOST 6 is made up of a drain 41 which is connected to the horizontal signal output line 7, a source 42 which is connected to the vertical signal output line 5, and a gate electrode 43. The photodiode 4 and the vertical switching transistor 3 are fabricated in the impurity layer 28-4. The photodiode 4 is constructed by exploiting the source of the vertical switching MOST 3. Numeral 44 designates the drain of the MOST 3 connected to the vertical signal output line 5, and numeral 45 the gate electrode of the MOST 3. Symbols 37-3 and 37-4 indicate electrodes which are respectively connected to the impurity layers 28-3 and 28-4 through contact holes 38-3 and 38-4 and further an impurity layer 39 (39-3, 39-4) of the second conductivity type.

The impurity concentration $N_2$ of the second conductivity type of the impurity layer 28 becomes higher than the impurity concentration $N_1$ of the first conductivity type of the semiconductor body 10 in relation to the fabrication. The impurity concentration $N_2'$ of the second conductivity type of the impurity layer 39 requires to exceed a predetermined concentration in order to establish the contact with the electrode 37. (In general, it becomes higher than the impurity concentration of the impurity layer 28. However, in case where the impurity concentration of the impurity layer 28 is very high and where the contact with the electrode 37 is satisfactorily established, the impurity layer 39 need not be disposed, and the electrode 37 may be brought into direct contact with the impurity layer 28 through the contact hole 38.) The concentration $N_1'$ of the source (or drain) of the first conductivity type impurity layer to be formed in the impurity layer 28 may be selected to a value higher than the impurity concentration $N_2$ of the second conductivity type of the impurity layer 28 and equal to or higher than the impurity concentration $N_2'$ of the second conductivity type of the impurity layer 39 in order to effect the operation as the MOS transistor. That is, the relation of the following equation (5) may be satisfied:

$$N_1' \gtrsim N_2' > N_2 > N_1 \tag{5}$$

As an example fulfilling the above equation, in case where the impurity concentration $N_1$ of the semiconductor body 10 is selected to $10^{15}/\text{cm}^3$ being the commonest, the concentration $N_2$ may be set at $10^{15}$–$10^{17}/\text{cm}^3$, the concentration $N_2'$ at $10^{18}$–$10^{21}/\text{cm}^3$ and the concentration $N_1'$ at $10^{18}$–$10^{21}/\text{cm}^3$.

When a voltage is applied to the impurity layer 28 (the polarity of the voltage is selected so that the drain (source) junction in this impurity layer may be back biased with an applied voltage to the body 10 being made the earth voltage, that is, a $\ominus$ voltage is applied when the impurity layer 28 is of the P-type and a $\oplus$ voltage is applied when it is of the N-type), the substrate bias effect acts on the MOST located in the impurity layer 28, with the result that the threshold voltage of the MOST varies depending on the applied voltage $V_2$. Letting $V_T$ denote the intrinsic threshold voltage under the state under which the voltage $V_2$ is not applied (all the threshold voltages previously described correspond thereto), the threshold voltage after the variation $V_T'$ is given by the following equation:

$$|V_T'| = |V_T| + |K|(\sqrt{|V_2| + 2\psi_F} - \sqrt{2\psi_F}) \tag{6}$$

where K and $\psi_F$ denote the substrate bias constant and the Fermi level which are determined by the impurity concentration of the impurity layer 28, etc., respectively.

The conditions of Eqs. (3) and (4) required in the imaging device of this invention are to be fulfilled. More specifically, as understood from Eq. (6), the voltage $V_2{}^V_{(SC)}$ applied to the electrode 37-1 (vertical scanner region 25) is made greater than the voltage $V_2{}^H_{(SC)}$ applied to the electrode 37-2 (horizontal scanner region 23). The voltage $V_2{}^V_{(SW)}$ applied to the electrode 37-4 (photoelectric conversion element region 26) is made greater than the voltage $V_2{}^H_{(SW)}$ applied to the electrode 37-3 (horizontal switch region 24).

$$|V_2{}^V_{(SC)}| > |V_2{}^H_{(SC)}| \tag{7}$$

$$|V_2{}^V_{(SW)}| > |V_2{}^H_{(SW)}| \tag{8}$$

Therefore, by applying voltages meeting Eqs. (7) and (8) to the electrodes 37-1, 37-2, 37-3 and 37-4, the threshold voltages of the MOST's located in the impurity layers 28 can be readily made desired values, and the desired end can be achieved. Especially in the construction of the present embodiment, the horizontal scanner and the horizontal switching transistors are integrated in the different impurity layer regions, which brings forth also the effect that noise arriving at the horizontal signal output line from the horizontal scanner can be reduced.

As an example, a solid-state imaging device was prepared in such a way that a P-type well diffused layer 28 having an impurity concentration of $8 \times 10^{15}/cm^3$ was disposed in an N-type silicon body 10 having an impurity concentration of $10^{15}/cm^3$. In the solid-state imaging device, the various voltages were set as follows:

| | |
|---|---|
| $V_2{}^V{}_{(SC)}$: $-3$ V | $(V_T{}^V{}_{(SC)} = 1.5$ V$)$ |
| $V_2{}^H{}_{(SC)}$: $0$ V | $(V_T{}^H{}_{(SC)} = 0$ V$)$ |
| $V_2{}^V{}_{(SW)}$: $-3$ V | $(V_T{}^V{}_{(SW)} = 1.5$ V$)$ |
| $V_2{}^H{}_{(SW)}$: $0$ V | $(V_T{}^H{}_{(SW)} = 0$ V$)$ |

Thus, the horizontal scanner could be made higher in the operating speed than the vertical scanner, and the leakage current of the vertical switching MOST could be reduced.

EMBODIMENT 2

Figure 6:
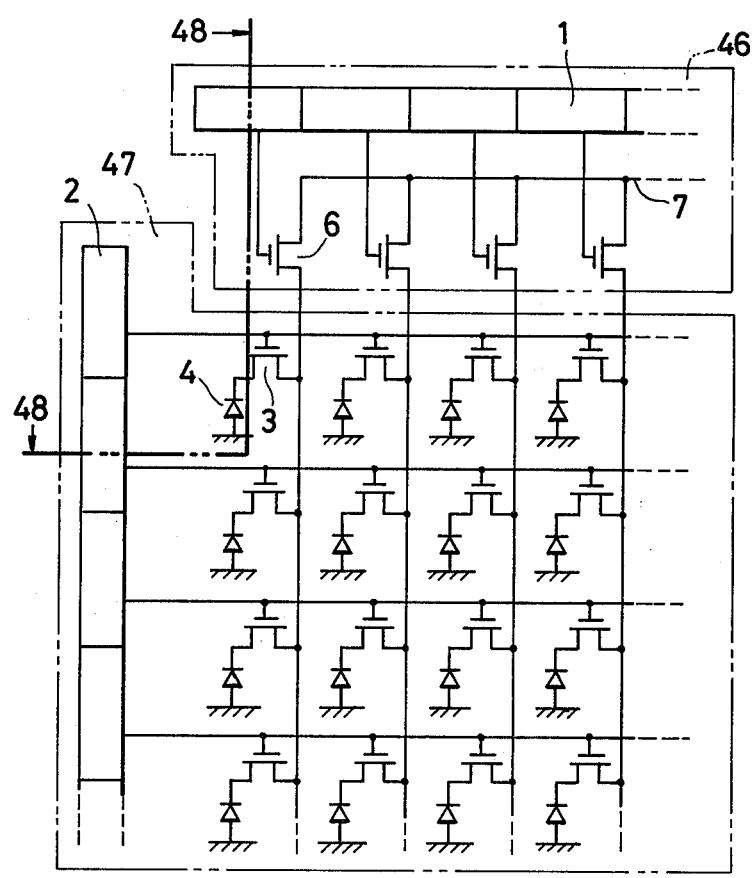
FIG. 6 is a schematic circuit diagram showing a second embodiment of the solid-state imaging device of this invention.
Figure 7:
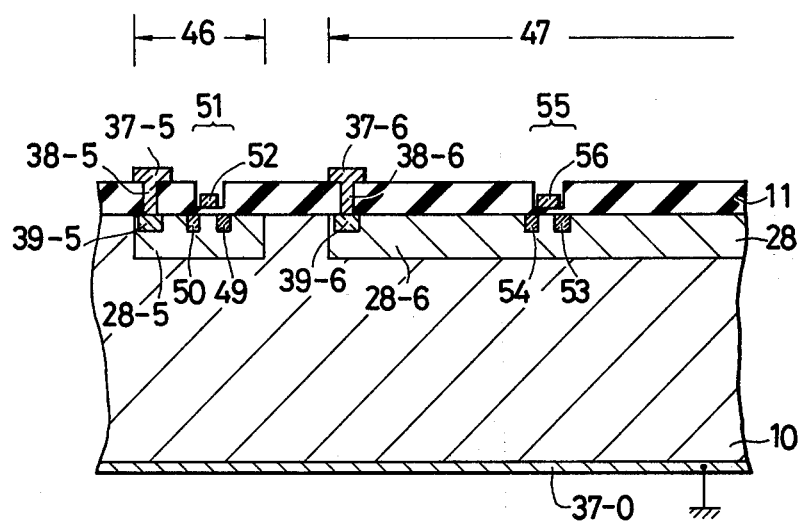
FIG. 7 is a schematic sectional view of the solid-state imaging device of FIG. 6 as taken along line 48 in FIG. 6.

In the first embodiment, it has been considered to make the threshold voltages different in the four regions. For the sake of simplicity, however, it is allowed to put together the two regions of the vertical scanner region 25 and the photoelectric conversion element region 26 which have the higher threshold voltages and to put together the two regions of the horizontal scanner region 23 and the horizontal switch region 24 which have the lower threshold voltages. FIG. 6 is a conceptual diagram of a solid-state imaging device in the case where the threshold voltages are made different in two regions. Numeral 46 designates a region which includes a horizontal scanner 1 and horizontal switching MOST's 6, while numeral 47 indicates a region which includes a vertical scanner 2, photodiodes 4 and vertical switching MOST's 3 connected thereto. Of course, as another embodiment, it is allowed to form the horizontal scanner and horizontal switching MOST's in a first impurity layer, the vertical scanner in a second impurity layer, and the photodiodes and the vertical switching MOST's connected thereto in a third impurity layer. Further, the horizontal scanner may be formed in a first impurity layer, the vertical scanner in a second impurity layer, and the horizontal switching MOST's and the picture elements consisting of the photodiodes and the vertical switching MOST's connected thereto in a third impurity layer. In this case, the horizontal scanner and the vertical scanner are isolated, the horizontal scanner and the horizontal switches are isolated, and the scanners and the picture elements are isolated. FIG. 7 is a sectional view in which a cut plane of the imaging device of this invention shown in FIG. 6 is seen in the direction of arrows 48 indicated in FIG. 6. Numeral 10 designates a semiconductor body of a first conductivity type (e.g., N-type). Symbol 28-5 denotes an impurity layer which is made of an impurity of a second conductivity type (e.g., P-type) and which corresponds to the region 46, while symbol 28-6 denotes an impurity layer which is made of an impurity of the second conductivity type (e.g., P-type) and which corresponds to the region 47. Numerals 49 and 50 indicate the drain (or source) and the source (or drain) of a MOST 51 constituting the horizontal scanner 1 or the horizontal switching MOST, and the regions 49 and 50 are impurity diffused layers of the first conductivity type identical to the conductivity type of the body 10. Numeral 52 indicates the gate electrode of the MOST 51. Shown at 11 is an insulating oxide film. Numerals 53 and 54 indicate the drain (or source) and the source (or drain) of a MOST 55 constituting the vertical scanner 2 (a MOST constituting the vertical switch 3 and the photodiode 4 are not shown), and the regions 53 and 54 are impurity diffused layers of the first conductivity type. Numeral 56 indicates the gate electrode of the MOST 55. Further, reference 37-5 represents an electrode which is connected to the impurity layer 28-5 through a contact hole 38-5 as well as a second conductivity type-impurity layer 39-5, while reference 37-6 represents an electrode which is connected to the impurity layer 28-6 through a contact hole 38-6 as well as a second conductivity type-impurity layer 39-6. The relationship among the concentration $N_1$ of the body 10, the concentrations $N_2$ and $N_2'$ of the respective impurity layers 28 and 39 of the second conductivity type, and the concentration $N_1'$ of the drain (source) of the first conductivity type is the same as Eq. (5). In the present embodiment, it is desired that the threshold voltage of the MOST situated in the region 47 is higher than the threshold voltage of the MOST situated in the region 46, and hence, the voltage $V_2{}^V$ applied to the electrode 37-6 may be made higher than the voltage $V_2{}^H$ applied to the electrode 37-5. That is, the relation of the following equation (9) may be fulfilled:

$$|V_2{}^V| > |V_2{}^H| \qquad (9)$$

EMBODIMENT 3

As the expedient for setting the threshold voltages at the values which locally differ depending on the functions, it has been described above that the impurity layers having the conductivity type opposite to that of the semiconductor body are disposed and that the voltages different from each other or one another are applied to the impurity layers. However, the threshold voltages of the MOST's in the respective regions of the four regions in the first embodiment (FIG. 4) or the two regions in the second embodiment (FIG. 6) can be varied by making different the concentrations of the channel regions of the MOST's in the semiconductor body or substrate.

Figure 8:
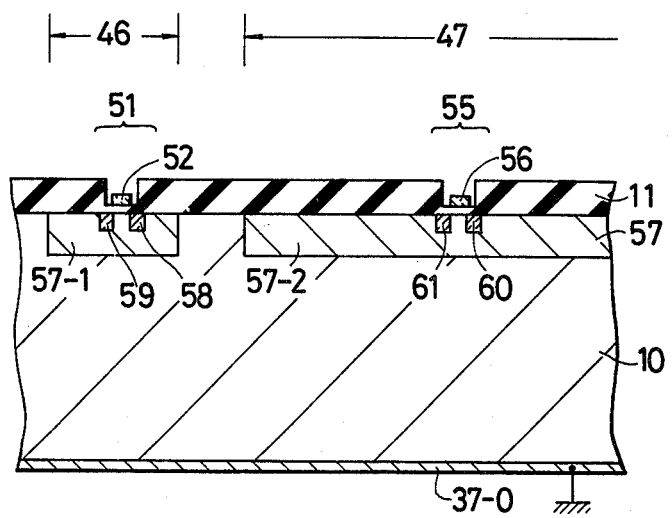
FIG. 8 is a schematic sectional view of a solid-state imaging device of a third embodiment of this invention.

FIG. 8 shows a sectional structure (corresponding to FIG. 7) of an embodiment wherein the threshold voltages of two regions are made different as in the embodiment of FIG. 6 for the sake of simplicity but by the substrate concentrations. Since a plan construction is the same as in FIG. 6, it is omitted from the illustration. Numeral 10 designates a semiconductor (e.g., Si) substrate of a first conductivity type. Reference 57-1 denotes an impurity layer which has the same conductivity type as that of the substrate and which corresponds to the region 46, while reference 57-2 indicates an impurity layer which has the same conductivity type as that of the substrate and which corresponds to the region 47. Numerals 58 and 59 designate the drain (or source) and the source (or drain) of a MOST 51 constituting the horizontal scanner 1 or the horizontal switching MOST, and these regions are impurity layers of a second conductivity type. Numerals 60 and 61 indicate the drain (or source) and the source (or drain) of a MOST 55 constituting the vertical scanner 2, and these regions are impurity layers of the second conductivity type. Numeral 52 represents the gate electrode of the MOST 51, and numeral 56 the gate electrode of the MOST 55. In case of the present structure, the threshold voltages depend on the concentrations of the first conductivity type impurity in the impurity layers 57-1 and 57-2, and they rise with increase of the concentrations. Accordingly, the concentration $N_1^V$ of the impurity layer 57-2 may be made higher than the concentration $N_1^H$ of the impurity layer 57-1.

$$N_1^V > N_1^H \tag{10}$$

In case where the impurity concentration of the substrate 10 is selected to $10^{15}/cm^3$ being the commonest, the concentration $N_1^H$ may be selected to approximately $10^{15}$–$10^{16}/cm^3$ and the concentration $N_1^V$ to approximately $5 \times 10^{15}$–$10^{17}/cm^3$. As a special example, the impurity concentration of the region corresponding to the region 46 may be identical to that of the substrate. In this case, the impurity layer 57-1 need not be disposed, and the drain and source of the MOST 51 may be fabricated directly on the substrate. The impurity layers 57-1 and 57-2 can be simply formed by the conventional diffusion process or ion-implantation process.

EMBODIMENT 4

Figure 9:
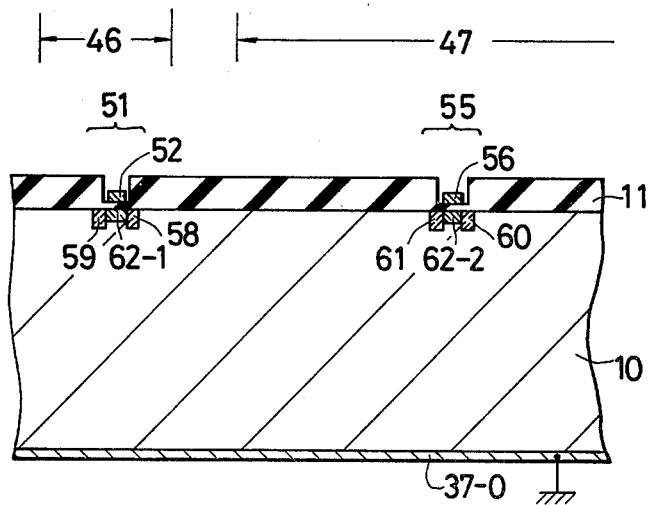
FIG. 9 is a schematic sectional view of a solid-state imaging device of a fourth embodiment of this invention.

In the embodiment of FIG. 8, it has been considered that the impurity layer having the concentration higher than that of the substrate is disposed in the whole corresponding region. When only the channel region of the MOST is highly doped, a similar effect can of course be achieved. FIG. 9 shows a sectional structure of a device of an embodiment wherein the threshold voltages of the two regions 46 and 47 are made different as in the embodiment of FIG. 8 but by channel concentrations. Referring to FIG. 9, numerals 58 and 59 designate the drain (or source) and the source (or drain) of a MOST 51 provided in the region 46, and these regions are impurity layers of a second conductivity type opposite to a first conductivity type of a substrate 10. Symbol 62-1 indicates a region which underlies the gate electrode 52 of the MOST 51. The region 62-1 is an impurity layer which is disposed in a channel portion and which has the same conductivity type as that of the substrate but has an impurity concentration higher than that of the substrate. The impurity layer is provided in each of the MOST's disposed in the region 46. Numerals 60 and 61 designate the drain (or source) and the source (or drain) of a MOST 55 formed in the region 47, and these regions are impurity layers of the second conductivity type. Shown at 56 is the gate electrode of the MOST 55. Symbol 62-2 represents an impurity layer which is provided in the channel portion of the MOST 55. Likewise to the impurity layer 62-1, the impurity layer 62-2 is provided in each of the MOST's disposed in the region 47. As in the case of the embodiment of FIG. 8, the impurity concentration $N_1^V{}_{(CH)}$ of the impurity layer 62-2 is set to be higher than the concentration $N_1^H{}_{(CH)}$ of the impurity layer 62-1.

$$N_1^V{}_{(CH)} > N_1^H{}_{(CH)} \tag{11}$$

As described above in detail in conjunction with the embodiments, the threshold voltages of MOST's constituting a horizontal scanner, a vertical scanner, horizontal switches and vertical switches are made different values so that the respective circuits may satisfy their functions, whereby (1) high and low scanning rates can be attained and (2) the leakage currents of the switches can be diminished. Furthermore, the threshold voltages of the MOST's can be simply selected to predetermined values by disposing impurity layers of a conductivity type opposite to that of a semiconductor body or by disposing impurity layers having the same conductivity type as that of the semiconductor body but an impurity concentration different from that of the semiconductor body. Therefore, no problem is posed in the fabrication.

In case where, in the solid-state imaging device of this invention, the scanner and the switching transistors are disposed in different regions, there is the secondary effect that the quantity in which the inductive noise of clock pulses for driving the scanner or scan pulses arrive at the switching transistors becomes very small, so the enhancement of the signal-to-noise ratio, i.e., the improvement of the picture quality can be achieved.

In any of the foregoing embodiments, the vertical scanner and the horizontal scanner may of course be either scanning circuits of the same form, or scanning circuits of different forms respectively suitable for the vertical scanning and the horizontal scanning.

In the above description, the combination between a photodiode and a switching MOST has been exemplified as a picture element. However, the use of a MOS diode employed in a charge transfer device, a phototransistor or a CID (charge injection device) can be considered for the photosensitive element and the use of a junction type field effect transistor can be considered for the switching element within a scope not departing from the subject matter of this invention.

What is claimed is:

1. A solid-state imaging device comprising
    a semiconductor body of a first conductivity type having first, second, third and fourth surface regions,
    a plurality of photoelectric elements disposed in a first surface region, arranged in a two dimensional array,
    a plurality of vertical switching MOSTs disposed in a first surface region, and being for addressing a vertical direction of said array,
    a plurality of horizontal switching MOSTs disposed in a second surface region, and being for addressing a horizontal direction of said array,
    a plurality of first MOSTs constituting a vertical scanning circuit for addressing said vertical switching MOSTs, and disposed in a third surface region, and
    a plurality of second MOSTs constituting a horizontal scanning circuit for addressing said horizontal switching MOSTs, and disposed in a fourth surface region, and
    wherein a threshold voltage $V_T{}^H{}_{(SC)}$ of said second MOST is lower than a threshold voltage $V_T{}^V{}_{(SC)}$ of said first MOST.

2. A solid-state imaging device according to claim 1, wherein a threshold voltage $V_T{}^V{}_{(SW)}$ of said vertical switching MOST is higher than a threshold voltage $V_T{}^H{}_{(SW)}$ of said horizontal switching MOST.

3. A solid-state imaging device according to claim 2, wherein said $V_T{}^V{}_{(SW)}$ is 0.25 V or more higher voltage then said $V_T{}^H{}_{(SW)}$ or more.

4. A solid-state imaging device according to claim 2, wherein said first surface region is included in said third surface region.

5. A solid-state imaging device according to claim 2, wherein said second surface region is included in said fourth surface region.

6. A solid-state imaging device according to claim 1, wherein said second surface region is included in said fourth surface region.

7. A solid-state imaging device according to claim 1, wherein said second surface region is included in said first surface region.

8. A solid-state imaging device according to claim 1, wherein said first, second third and fourth surface region have a second conductivity type opposite to said first conductivity type.

9. A solid-state imaging device according to claim 1, wherein said first, second, third and fourth surface region has said first conductivity type, and a impurity concentration of said third surface region is higher than that of said fourth surface region.

10. A solid-state imaging device according to claim 1, wherein a impurity concentration of a channel region of said first MOST is higher than that of said second MOST.

11. A solid-state imaging evice comprising
a semiconductor body of a first conductivity type having first, second, third and fourth surface regions of a second conductivity type opposite to said first conductivity type,
a plurality of picture elements disposed in said first surface region, arranged in a two dimensional array, and having a vertical switching MOST for addressing a vertical direction of said array, a source junction of said vertical switching MOST constitutes a pn junction photodiode between a source region of said vertical switching MOST and said first surface region,
a plurality of horizontal switching MOSTs disposed in a second surface region, and being for addressing a horizontal direction of said array,
a vertical scanning circuit for addressing said vertical switching MOSTs disposed in a third surface region,
a horizontal scanning circuit for addressing said horizontal switching MOSTs disposed in a fourth surface region,
first means for applying a first voltage $V_2{}^V{}_{(SC)}$ to an first electrode disposed on said third surace region, and second means for applying a second voltage $V_2{}^H{}_{(SC)}$ to a second electrode disposed on said fourth surface region, and
wherein said first voltage $V_2{}^V{}_{(SC)}$ is higher than said second voltage $V_2{}^H{}_{(SC)}$.

12. A solid-state imaging device according to claim 11, wherein said first means biases backwardly a pn junction which is constituted by said body and said third surface region, and
said second means biases backwardly a pn junction which is constituted by said body and said fourth surface region.

13. A solid-state imaging device according to claim 11, wherein impurity concentrations of said surface regions are higher than that of said semiconductor body.

14. A solid-state imaging device according to claim 11, wherein said first surface region is included in said third surface region.

15. A solid-state imaging device according to claim 14, wherein said second surface region is included in said third surface region.

16. A solid-state imaging device according to claim 11, wherein said second surface region is included in said fourth surface region.

17. A solid-state imaging device according to claim 11, further comprising means for applying a third voltage $V_2{}^V{}_{(SW)}$ to a third electrode disposed on said first surface region.

18. A solid-state imaging device accrding to claim 17, wherein said second surface region is included in said first surface region.

19. A solid-state imaging device according to claim 17, wherein said second surface region is included in said fourth surface region.

20. A solid-state imaging device according to claim 17, further comprising fourth means for applying a fourth voltage $V_2{}^H{}_{(SW)}$ lower than said third voltage $V_2{}^V{}_{(SW)}$ to a fourth electrode disposed on said second surface region.

* * * * *